United States Patent
Lin et al.

(10) Patent No.: US 9,991,302 B1
(45) Date of Patent: Jun. 5, 2018

(54) OPTICAL SENSOR WITH COLOR FILTERS HAVING INCLINED SIDEWALLS

(71) Applicant: VisEra Technologies Company Limited, Hsin-Chu (TW)

(72) Inventors: Kuo-Feng Lin, Kaohsiung (TW); Chin-Chuan Hsieh, Hsin-Chu (TW)

(73) Assignee: VisEra Technologies Company Limited, Hsin-Chu (TW)

( * ) Notice: Subject to any disclaimer, the term of this patent is extended or adjusted under 35 U.S.C. 154(b) by 0 days. days.

(21) Appl. No.: 15/354,337

(22) Filed: Nov. 17, 2016

(51) Int. Cl.
*H01L 27/146* (2006.01)
*H01L 31/0232* (2014.01)
*H01L 31/0216* (2014.01)

(52) U.S. Cl.
CPC .. *H01L 27/14621* (2013.01); *H01L 27/14623* (2013.01); *H01L 27/14645* (2013.01); *H01L 31/02162* (2013.01); *H01L 31/02164* (2013.01); *H01L 31/02327* (2013.01); *H01L 27/1464* (2013.01); *H01L 27/14627* (2013.01)

(58) Field of Classification Search
CPC .............. H01L 27/14621; H01L 27/14623
See application file for complete search history.

(56) References Cited

U.S. PATENT DOCUMENTS

| | | | | |
|---|---|---|---|---|
| 8,742,525 B2 * | 6/2014 | Ogita | ................ | H01L 27/14621 257/291 |
| 8,853,758 B2 * | 10/2014 | Ootsuka | ............ | H01L 27/14623 250/208.1 |
| 2009/0230490 A1 * | 9/2009 | Yokozawa | ........ | H01L 27/14621 257/432 |
| 2014/0264686 A1 * | 9/2014 | Tu | ..................... | H01L 27/14627 257/432 |

FOREIGN PATENT DOCUMENTS

| | | |
|---|---|---|
| JP | 2010272654 A | 12/2010 |
| JP | 2012227476 A | 11/2012 |
| JP | 2013156463 A | 8/2013 |
| JP | 2013179575 A | 9/2013 |
| JP | 2014179577 A | 9/2014 |
| JP | 2014225667 A | 12/2014 |
| JP | 2015092521 A | 5/2015 |
| JP | 2016036004 A | 3/2016 |
| JP | 2016066695 A | 4/2016 |
| JP | 2016096323 A | 5/2016 |

* cited by examiner

*Primary Examiner* — Daniel Luke

(74) *Attorney, Agent, or Firm* — Muncy, Geissler, Olds & Lowe, P.C.

(57) ABSTRACT

An optical sensor includes a sensing layer, a color filter, and a grid structure. The sensing layer includes a photodiode. The color filter includes a lower portion disposed on the sensing layer, and an upper portion disposed on the lower portion. The upper portion includes a bottom surface connected to the lower portion, a first inclined surface inclined relative to the bottom surface, and a second inclined surface that is opposite to the first inclined surface and inclined relative to the bottom surface. The grid structure surrounds the upper portion. Between the first inclined surface and the bottom surface is a first acute angle, and between the second inclined surface and the bottom surface is a second acute angle.

18 Claims, 9 Drawing Sheets

OPTICAL SENSOR WITH COLOR FILTERS HAVING INCLINED SIDEWALLS

BACKGROUND OF THE INVENTION

Field of the Invention

The present disclosure relates to an optical sensor, and in particular to an optical sensor with color filters.

Description of the Related Art

An optical sensor, such as a spectrum sensor or an image sensor, is configured to detect light or capture an image from an object. The optical sensor is generally mounted on an electrical device, such as a spectrum meter or a camera.

FIG. 1 is a schematic view of a conventional optical sensor B1. The optical sensor includes a sensing layer B10, color filters B20, and microlenses B30. The sensing layer B10 includes photodiodes B11 to sense light beams, and covert the light beams into electrical signals. The color filters B20 are disposed on the sensing layer B10, and the cross sections of the color filters B20 are rectangular. The microlens B30 are disposed on the color filters B20, and configured to focus the light beams to the photodiodes B11.

However, with the development of electrical devices, it has been requested that the electrical device be as thin as possible, and that the manufacturing cost of the electrical device be decreased. Therefore, the thickness of the conventional optical sensor B1 needs to be decreased to correspond to the thickness of the electrical device. Consequently, it is desirable that a solution for improving optical sensors be provided.

BRIEF SUMMARY OF THE INVENTION

The present disclosure provides an optical sensor with less thickness and a lower manufacturing cost.

The present disclosure provides an optical sensor including a sensing layer, a first color filter, and a grid structure. The sensing layer includes a photodiode. The first color filter includes a first lower portion disposed on the sensing layer, and an first upper portion disposed on the first lower portion. The first upper portion includes a first bottom surface connected to the first lower portion, a first inclined surface inclined relative to the first bottom surface, and a second inclined surface opposite to the first inclined surface and inclined relative to the first bottom surface.

The grid structure surrounds the first upper portion. Between the first inclined surface and the first bottom surface is a first acute angle, and between the second inclined surface and the first bottom surface is a second acute angle.

In some embodiments, the first acute angle and the second acute angle are in a range from about 65 degrees to 89 degrees. In some embodiments, the first acute angle is equal to the second acute angle. The first inclined surface and the second inclined surface are symmetrically arranged about the plane of symmetry of the first color filter.

In some embodiments, the first upper portion further includes a top surface opposite to the first bottom surface, and the first upper portion narrows gradually from the first bottom surface to the top surface.

In some embodiments, a cross section of the first upper portion has a trapezoidal shape, and the cross section of the first upper portion is perpendicular to the first bottom surface and the first inclined surface.

In some embodiments, the first lower portion and the first upper portion are formed as a single piece, and are made of the same materials.

In some embodiments, a shading structure surrounds the first lower portion, and the grid structure is disposed on the shading structure.

In some embodiments, the grid structure includes a first grid layer disposed on the shading structure, a second grid layer disposed on the first grid layer, and a third grid layer disposed on the second grid layer. The refractive index of the first grid layer is greater than the refractive index of the second grid layer, and the refractive index of the second grid layer is greater than the refractive index of the third grid layer.

In some embodiments, the cross sections of the first grid layer and the second grid layer are V-shaped. The materials of the first grid layer, the second grid layer, and the third grid layer are different. In some embodiments, a thickness of the first color filter is greater than 1 um.

In some embodiments, the first color filter further includes a first dome portion disposed on the first upper portion, and the first dome portion includes an arched top surface. The first lower portion, the first upper portion and the dome portion are formed as a single piece, and comprise the same materials.

In some embodiments, the color filter further includes a second color filter and a third color filter. The second color filter includes a second lower portion disposed on the sensing layer, and a second upper portion disposed on the second lower portion. The second upper portion includes a second bottom surface connected to the second lower portion, and a third inclined surface inclined relative to the second bottom surface.

The third color filter includes a third lower portion disposed on the sensing layer, and a third upper portion disposed on the third lower portion The third upper portion includes a third bottom surface connected to the third lower portion, and a fourth inclined surface inclined relative to the third bottom surface. Between the third inclined surface and the second bottom surface is a third acute angle. Between the fourth inclined surface and the third bottom surface is a fourth acute angle. The first acute angle is greater than the third acute angle, and the third acute angle is greater than the fourth acute angle.

In some embodiments, the first color filter is a blue color filter, the second color filter is a green color filter, and the third color filter is a red color filter.

In some embodiments, the first color filter further includes a first dome portion disposed on the first upper portion. The second color filter further includes a second dome portion disposed on the second upper portion. The third color filter further includes a third dome portion disposed on the third upper portion.

In some embodiments, the height of the first dome portion relative to the first upper portion is greater than the height of the second dome portion relative to the second upper portion. The height of the second dome portion relative to the second upper portion is greater than the height of the third dome portion relative to the third upper portion.

In some embodiments, the heights of the first dome portion relative to the first upper portion, the second dome portion relative to the second upper portion, and the third dome portion relative to the third upper portion is in a range from about 50 nm to 150 nm.

In some embodiments, an anti-reflection film disposed on the first upper portion, the second upper portion and the third portion. The thickness of the anti-reflection film is in a range from about 100 nm to 250 nm.

In some embodiments, the thickness of the anti-reflection film over the first upper portion is greater than a thickness of the anti-reflection film over the second upper portion. The thickness of the anti-reflection film over the second upper portion is greater than the thickness of the anti-reflection film over the third upper portion.

In conclusion, the optical sensor does not need to include conventional microlenses depending on the structure of the color filters. Therefore, the thickness and the manufacturing cost of the optical sensor are decreased.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
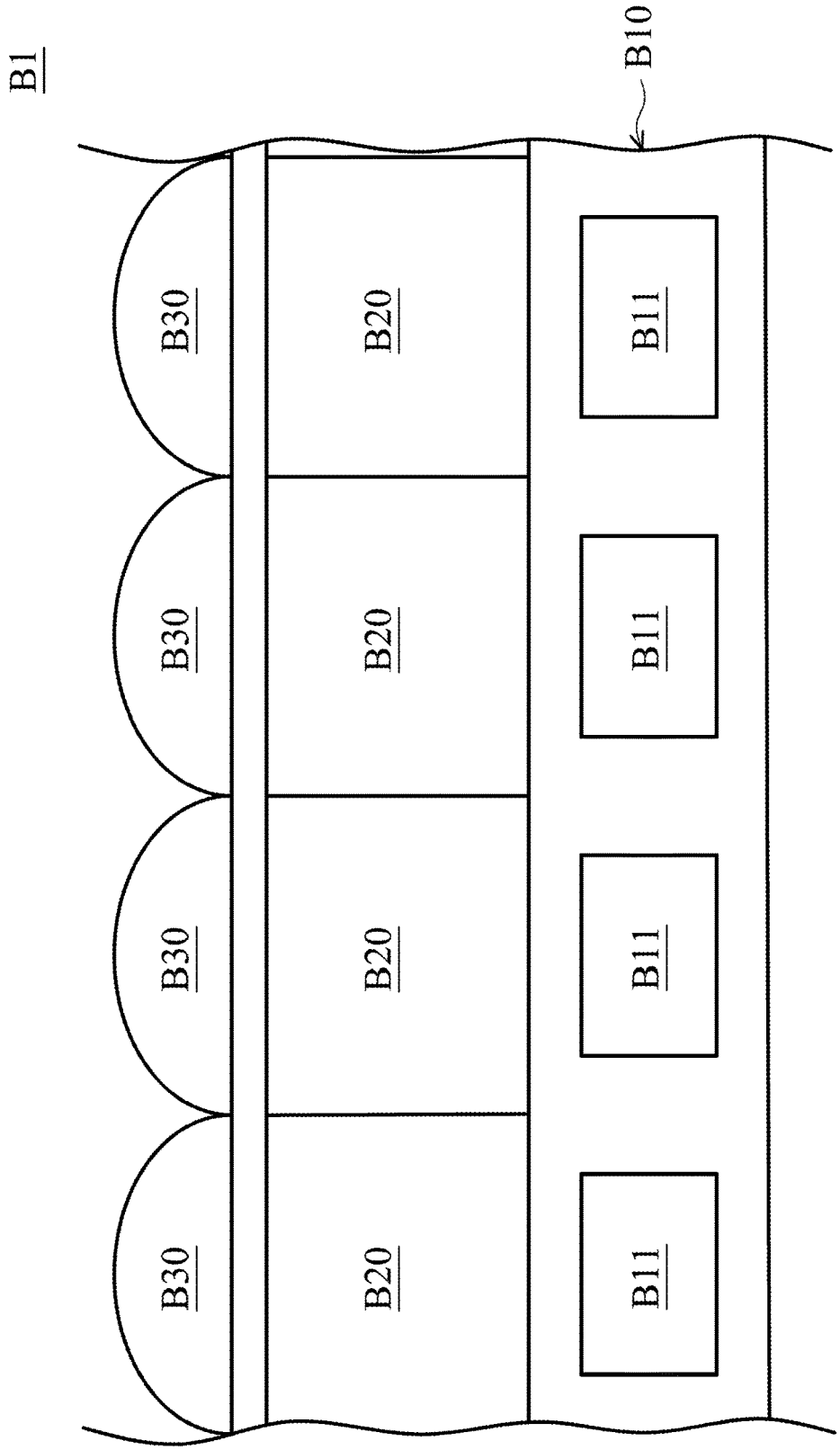
FIG. 1 is a schematic view of a conventional optical sensor B1.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale, or the drawings may be otherwise simplified for clarity of discussion, as they are intended merely for illustration.

It should be understood that additional operations can be provided before, during, and after the method, and some of the operations described can be replaced or eliminated for other embodiments of the method.

Figure 2:
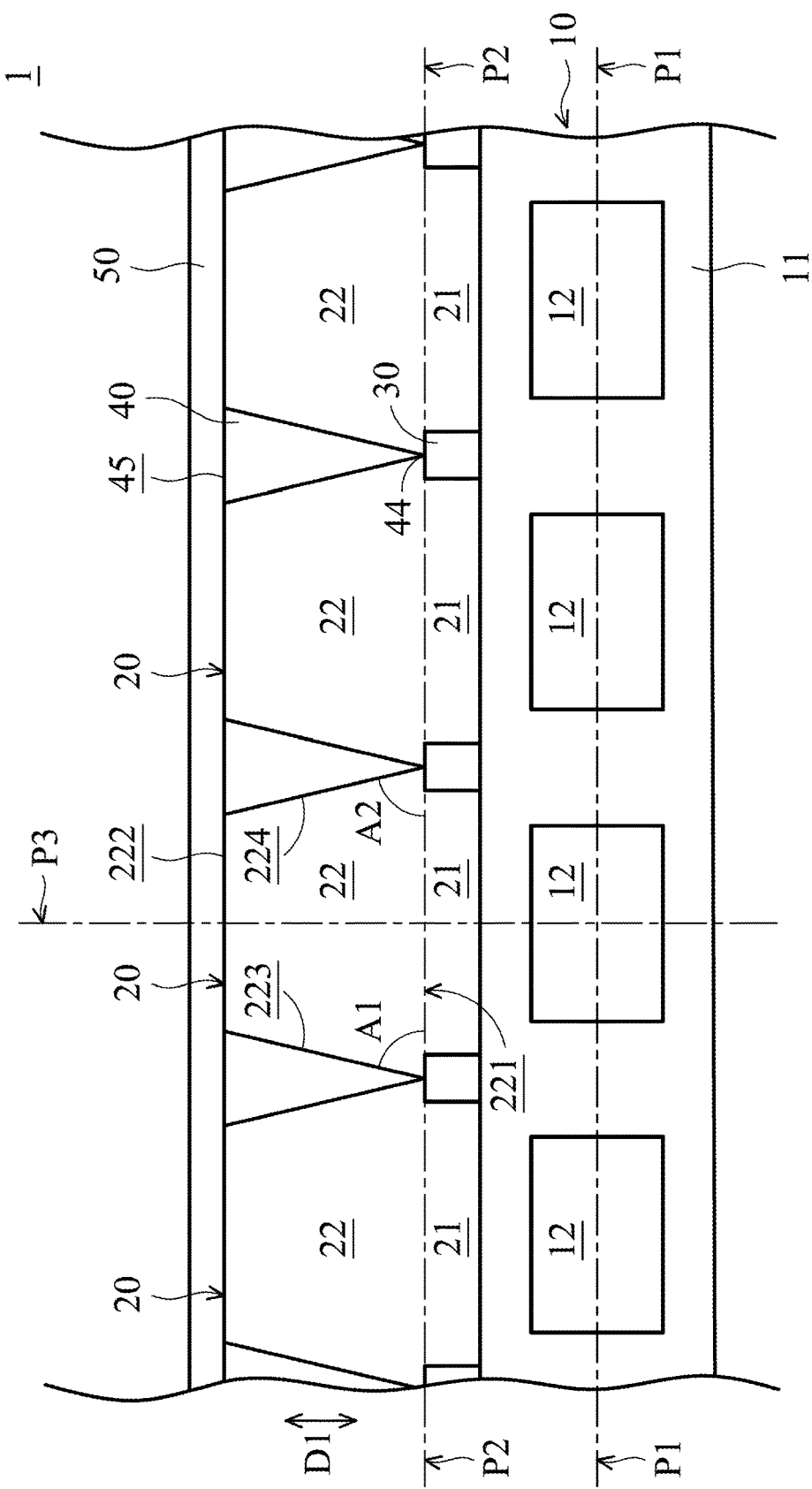
FIG. 2 is a schematic view of an optical sensor in accordance with some embodiments of the present disclosure.

FIG. 2 is a schematic view of an optical sensor 1 in accordance with some embodiments of the present disclosure. The optical sensor 1 is configured to sense light beams, and covert the light beams into electrical signals.

In some embodiments, the optical sensor 1 is a CMOS (Complementary Metal-Oxide-Semiconductor) sensor. In some embodiments, the optical sensor 1 is a BSI (backside illumination) CMOS sensor. In some embodiments, the optical sensor 1 is an image sensor configured to capture an image. The image sensor can be applied to an imaging apparatus, such as a digital camera.

In some embodiments, the optical sensor 1 is a spectrum sensor configured to detect the spectrum of an object. The spectrum sensor can be applied to a spectrum meter.

The optical sensor 1 includes a sensing layer 10, color filters 20, a shading structure 30, a grid structure 40, and an anti-reflection film 50. The sensing layer 10 extends along a reference plane P1. The sensing layer 10 is configured to detect incident light beams according to the light beams falling on the sensing layer 10.

The sensing layer 10 may include all of the following elements, but the sensing layer 10 does not necessarily include all of the following elements, as long as the object of the sensing layer 10 is achieved. The sensing layer 10 includes a substrate 11 and photodiodes 12. In some embodiments, the sensing layer 10 further includes another component or layer (not shown in figures), such as electrical circuits underneath of the photodiodes 12 and a passivation layer configured to protect the electrical circuits.

The photodiodes 12 are disposed in the substrate 11, and arranged in an array at the reference plane P1. Each of the photodiodes 12 is configured to sense light beams and generate electrical signals according to the intensity of the light beams falling thereon. In some embodiments, an image can be generated according to the electrical signals by a process chip (not shown in figures).

The color filters 20 are disposed on the sensing layer 10. In some embodiments, the color filters 20 are wave-guided color filters. Each of the color filters 20 is located over one of the photodiodes 12 in a stacking direction D1. The stacking direction D1 is perpendicular to the sensing layer 10 and the reference plane P1. The color filters 20 are arranged in an array on a plane parallel to the reference plane P1. The thickness of the color filters 20 is greater than 1 um.

Each of the color filters 20 allows a predetermined range of wavelengths of light beam to pass through. In some embodiments, color filters 20 include red color filters, green color filters, and blue color filters. For example, the red color filters allow wavelengths of a light beam in a range from 620 nm to 750 nm (red light) to pass to the photodiodes 12. The green color filters allow wavelengths of a light beam in a range from 495 nm to 570 nm (green light) to pass to the photodiodes 12. The blue color filters allow wavelengths of a light beam in a range from 476 nm to 495 nm (blue light) to pass to the photodiodes 12.

The color filters 20 include lower portions 21 and upper portions 22. The lower portions 21 are disposed on the sensing layer 10, and the upper portions 22 are disposed on the lower portions 21. The lower portion 21 and the upper portion 22 are formed as a single piece, and include the same materials.

The shading structure 30 is disposed on the sensing layer 10. The shading structure 30 surrounds and is connected to the lower portions 21. The shading structure 30 is arranged on a plane parallel to the reference plane P1. In some embodiments, the shading structure 30 has a transmittance lower than 30%. The shading structure 30 is configured to shield a light beam from passing through. Therefore, the quantity of the light beam in one color filter 20 transmitted to an adjacent color filter 20 is decreased.

The grid structure 40 is disposed on the shading structure 30. The grid structure 40 surrounds and is connected to the upper portions 22. The grid structure 40 is arranged on a plane parallel to the reference plane P1. The grid structure 40 includes bottom tips 44 connected to the shading structure 30, and top surfaces 45 connected to the anti-reflection film 50. In some embodiments, the top surfaces 45 of the grid structure 40 are flat planes.

The grid structure 40 has transmittances greater than 80% or 90%. The grid structure 40 is configured to reflect the light beam in the color filters 20 toward the photodiodes 12.

In some embodiments, the refractive indexes of the grid structure 40 and/or the shading structure 30 is lower than the refractive index of the color filters 20, and thus the color filters 20, the grid structure 40, and/or the shading structure 30 forms a light pipe structure to guide light beams to the photodiodes 12.

In some embodiments, the refractive index of the grid structure 40 is in a range from about 1.2 to 1.5. The shading structure 30 includes a refractive index in a range from about 1.3 to 1.9. The refractive index of the color filters 20 is in a range from about 1.7 to 3.2.

The anti-reflection film 50 is disposed on the upper portions 22 and the grid structure 40. The anti-reflection film 50 is configured to decrease the reflection of the light beam transmitted to the optical sensor 1. In some embodiments, the anti-reflection film 50 is a flat structure, parallel to the sensing layer 10. The thickness of the anti-reflection film 50 is in a range from about 100 nm to 250 nm.

As shown in FIG. 2, the cross section of the lower portion 21 has a rectangular shape. The cross section of the upper portion 22 has a trapezoidal shape. The cross section of the shading structure 30 includes rectangular shapes. The cross section of the grid structure 40 includes triangular shapes.

The described cross sections are perpendicular to the reference plane P1, the reference plane P2, the bottom surface 221, and the sensing layer 10. In some embodiments, the described cross sections are perpendicular to the inclined surface 223, and/or the inclined surface 224.

Each of the upper portions 22 includes a bottom surface 221, a top surface 222, an inclined surface 223, and an inclined surface 224. In some embodiments, the bottom surfaces 221, the top surfaces 222, the inclined surfaces 223, and/or the inclined surfaces 224 are flat surface.

The bottom surfaces 221 are connected to the lower portions 21. In some embodiments, the bottom surfaces 221 and the top surfaces of the shading structure 30 are located in a reference plane P2 parallel to the reference plane P1.

The top surface 222 is opposite to the bottom surface 221, and parallel to the bottom surface 221. The top surface 222 is connected to the anti-reflection film 50. The area of the bottom surface 221 is greater than the area of the top surface 222. The upper portion 22 narrows gradually from the bottom surface 221 to the top surface 222.

The inclined surface 223 is inclined relative to the bottom surface 221. The inclined surface 224 is opposite to the inclined surface 223, and inclined relative to the bottom surface 221. The inclined surface 223 and the inclined surface 224 are symmetrically arranged about the symmetry plane P3 of the color filter 20. The symmetry plane P3 is located at the center of the color filter 20, and parallel to the bottom surface 221.

Between the inclined surface 223 and the bottom surface 221 are an acute angle A1, and between the inclined surface 224 and the bottom surface 221 are an acute angle A2. The acute angle A1 and the acute angle A2 are in a range from about 65 degrees to 89 degrees. In this embodiment, the acute angle A1 is equal to the acute angle A2.

The distances between the inclined surface 223 and the inclined surface 224 are gradually decreased from the bottom surface 221 to the top surface 222. The distances are measured in a direction parallel to the bottom surface 221.

Depending on the structures and designs of the color filters 20 and the grid structure 40, the light beam emitted to the optical sensor 1 is greatly guided to the photodiodes 12. In this embodiment, the conventional microlenses can be omitted in the optical sensor 1. By omitting the conventional microlenses, the thickness and the manufacturing cost of the optical sensor 1 is decreased.

Figure 3:
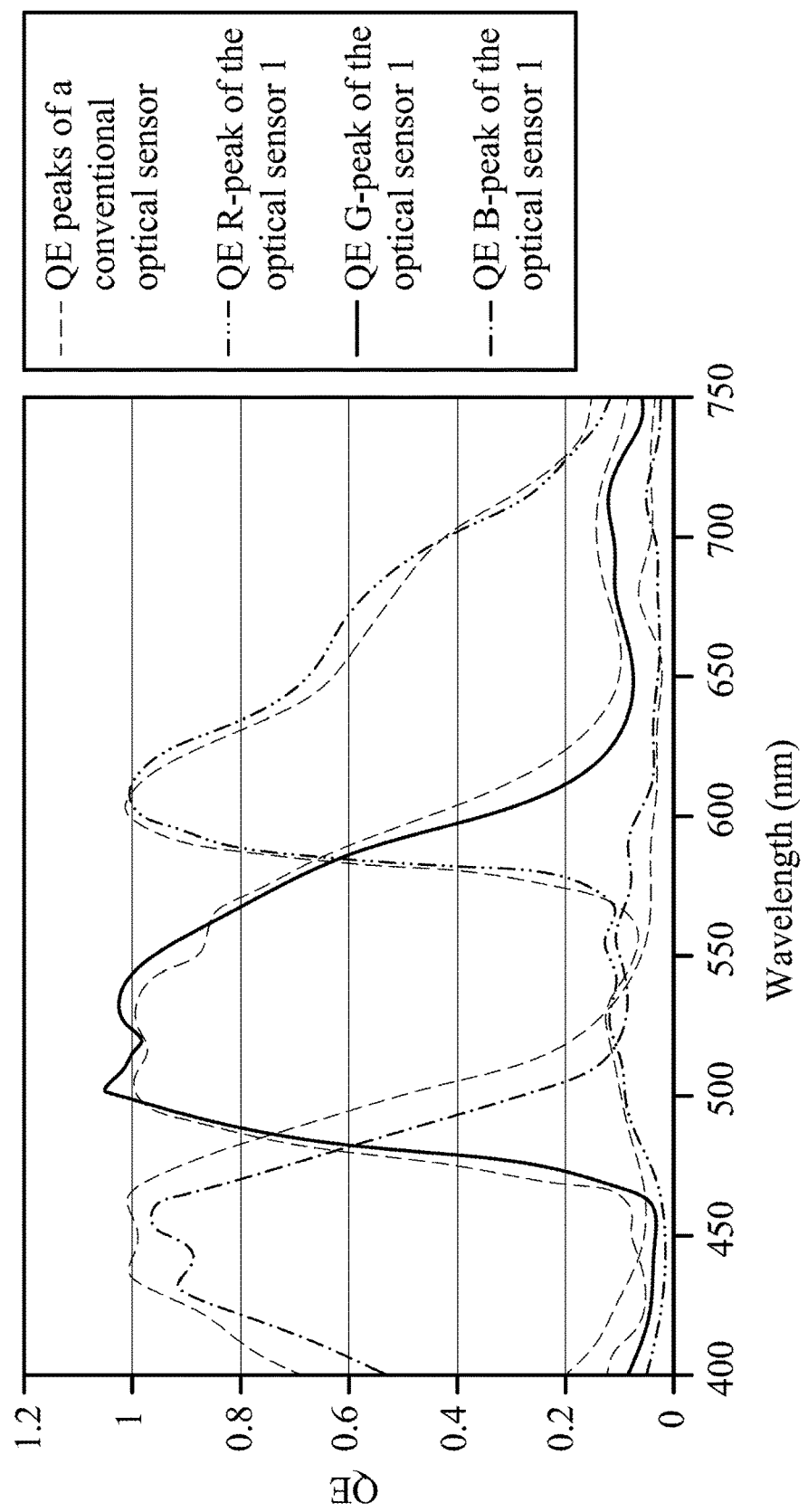
FIG. 3 is wavelength vs. QE spectrum diagram of the optical sensor of the present disclosure and a conventional optical sensor with microlenses.

FIG. 3 is wavelength vs. QE spectrum diagram of the optical sensor 1 of the present disclosure and a conventional optical sensor with microlenses. In this case, the acute angles A1 and A2 of the optical sensor 1 are 78 degrees, for example. In FIG. 3, light beams with different wavelengths are emitted on red color filters, green color filters, and blue color filters.

As shown in FIG. 3, the sensitivity of the optical sensor 1 of the present disclosure is improved according to the QE (Quantum Efficiency) spectrum. The QE peaks of the optical sensor 1 are increased in comparison with the conventional optical sensor with microlenses. In addition, the optical cross talk of the optical sensor 1 is decreased in comparison with the conventional optical sensor.

Figure 4A:
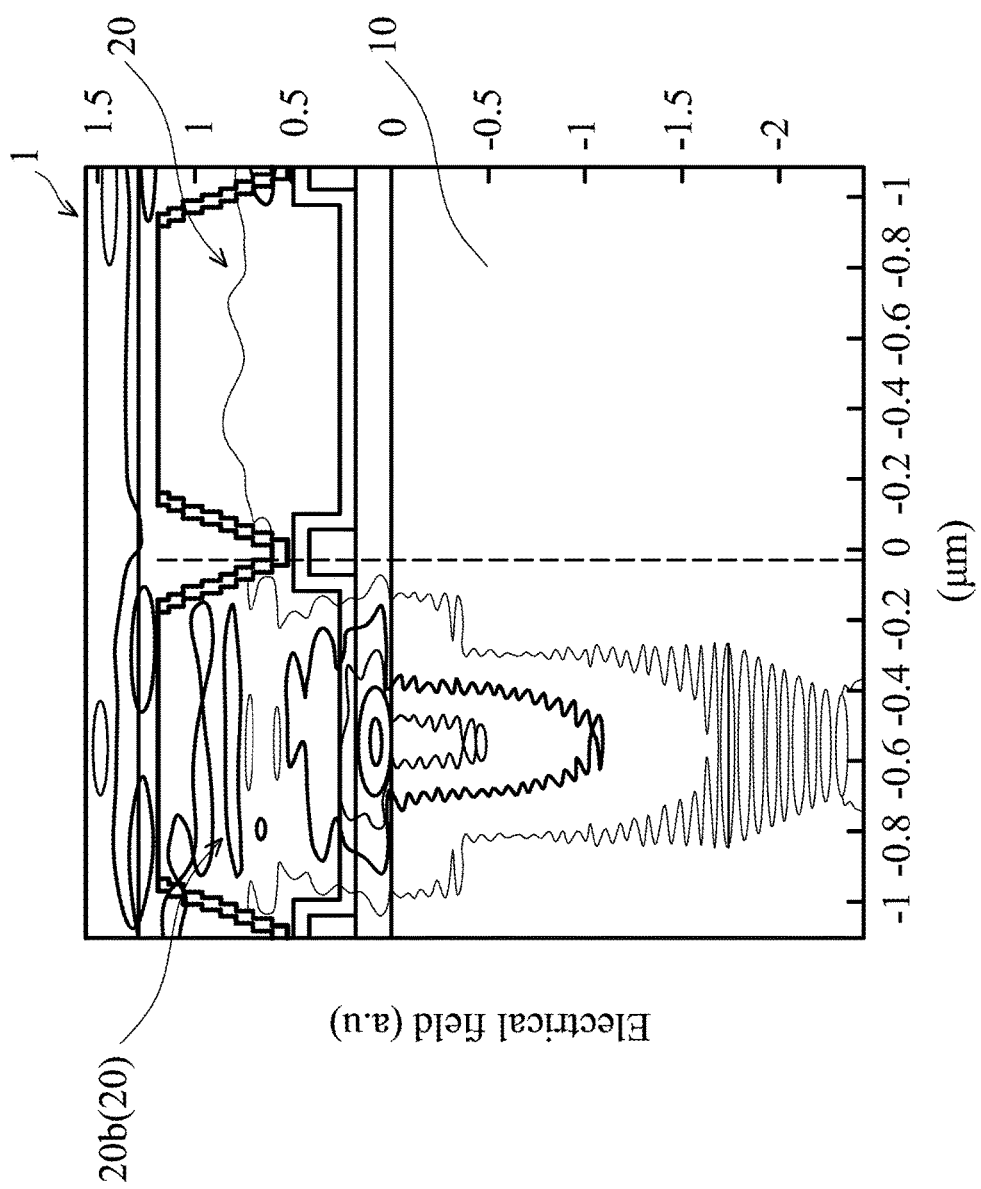
FIG. 4A is an electrical field distribution diagram in a cross section of the optical sensor of the present disclosure resulted from a simulation to illuminate the optical sensor of the present disclosure with a light beam wavelength of 530 nm using an FDTD (Finite-difference time-domain) simulation method.

As shown in FIG. 4A, in the optical sensor 1 of the present disclosure, the electric field intensity is more observable in a region of the green color filter 20b and the sensing layer 10 under the green color filter 20b. Moreover, the electrical field distribution in a region of an adjacent color filter 20, such as a red color filter or a blue color filter, and the sensing layer 10 under the adjacent color filter 20 is extremely low. Therefore, the optical cross talk of the optical sensor 1 is decreased. In addition, the reflection of the color filters 20 is low, and the standing wave effect of the color filters 20 is low. According to the fact that the electric field passing through the green color filters 20b and the underlying sensing layers 10 is deeper and more vertical as shown in FIG. 4A, the green color filters 20b and the underlying sensing layers 10 have high photo flux.

Figure 4B:
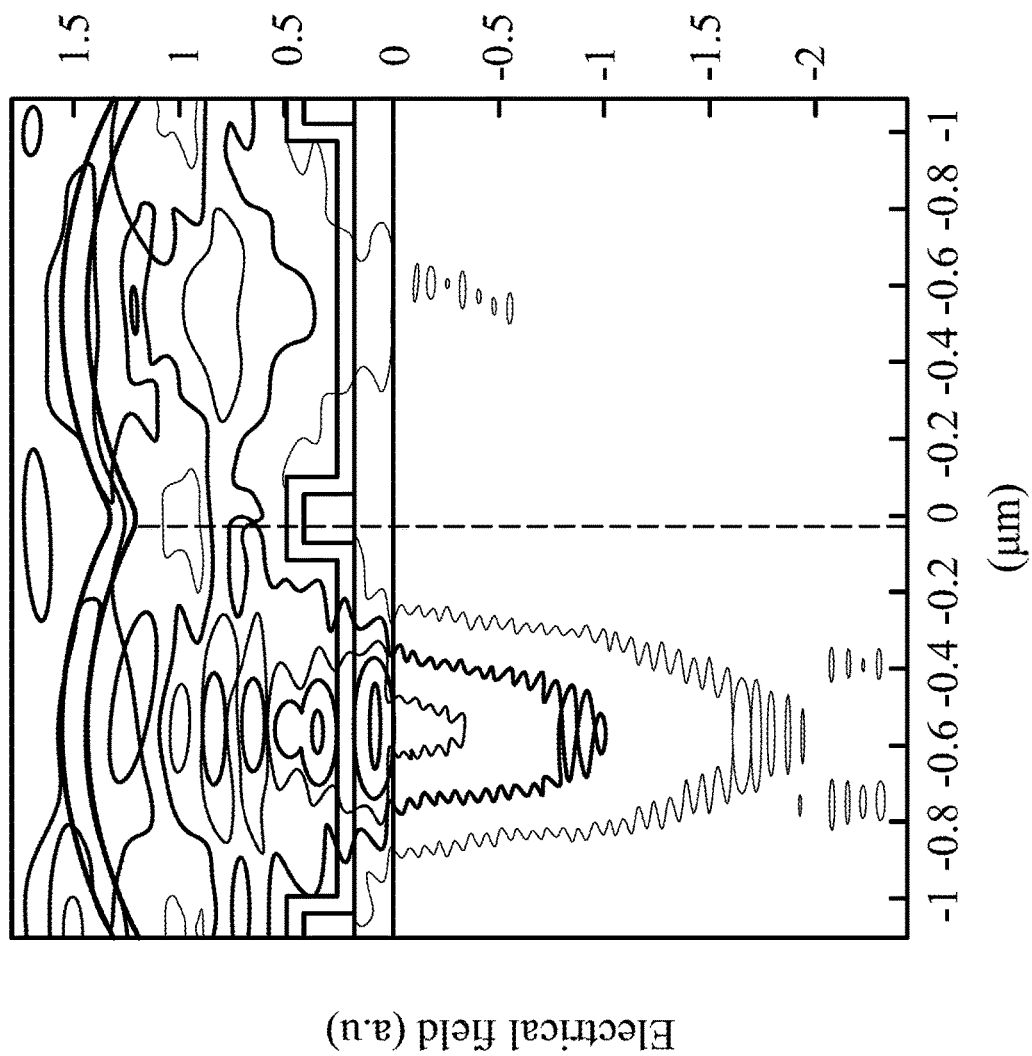
FIG. 4B is an electrical field distribution diagram in a cross section of a conventional optical sensor resulted from a simulation to illuminate the conventional optical sensor with a light beam wavelength of 530 nm using the same FDTD simulation method.

As shown in FIG. 4B and compared to FIG. 4A, in the conventional optical sensor, the electric field passing through the green color filters and the underlying sensing layers (at the left side of the dashed line in FIG. 4B) is shallower and does not pass through the sensing layers vertically as that shown in FIG. 4A. That means the green color filters and the underlying sensing layers 10 in the conventional optical sensor have lower photo flux. Further, in a region adjacent to the green color filter, such as a red color filter or a blue color filter (at the right side of the dashed line in FIG. 4B), the electric field distribution is denser than that shown in FIG. 4A. That means the conventional optical sensor suffer more seriously from optical cross talk. As a result, according to the optical sensor 1 of the present disclosure, the QE can be increased and the optical cross talk in the optical sensor 1 can be decreased.

Figure 5A:
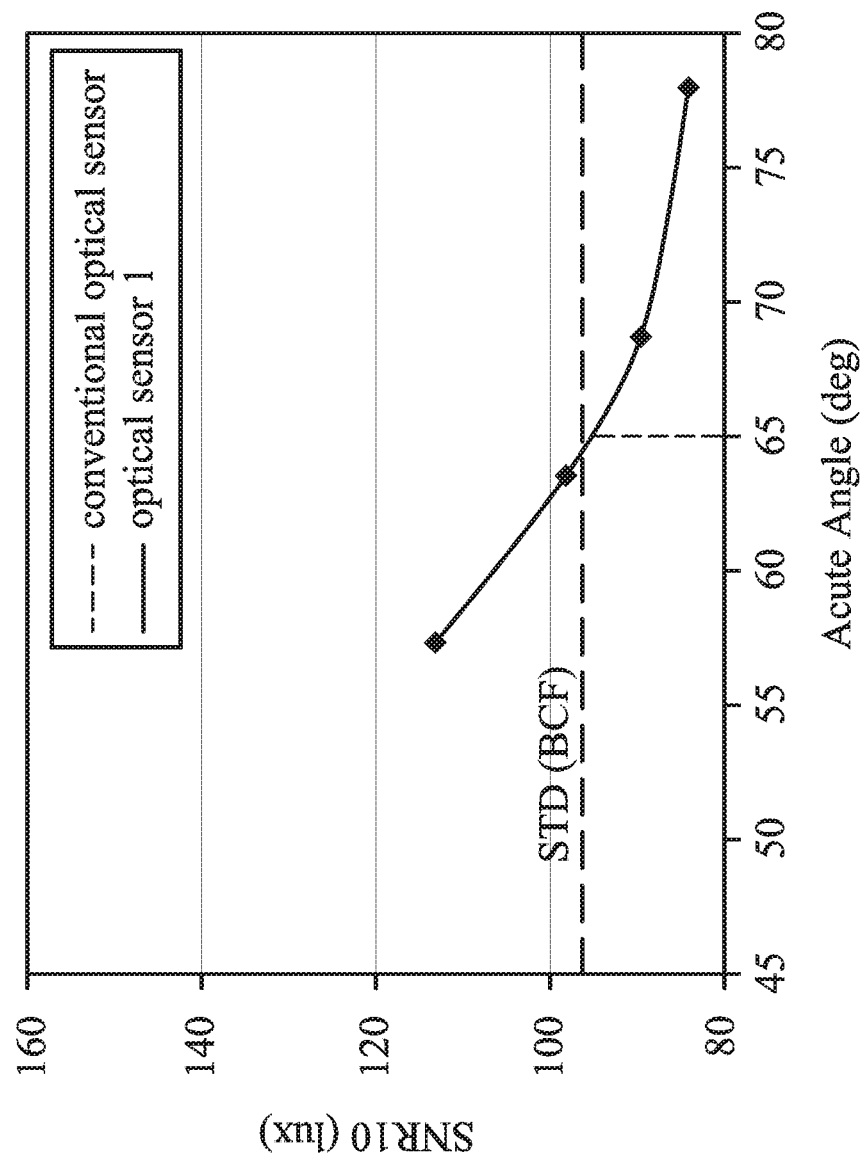
FIG. 5A shows acute angle vs. SNR 10 diagrams of the optical sensor and the conventional optical sensor in accordance with some embodiments of the present disclosure.

FIG. 5A shows acute angle vs. SNR 10 diagrams of the optical sensor 1 and the conventional optical sensor in accordance with some embodiments of the present disclosure. SNR (Signal-to-Noise Ratio) at low illumination is a key performance of an image sensor (optical sensor). The low illumination is an environment represented in a low light environment, such as an overcast environment, nightfall environment, and indoor environment. In application, when SNR is controlled at a predetermined value, the corresponding illumination level is expected to be as minimal as possible to yield the acceptable image. In general, when SNR=10, the image generated by the optical sensor is acceptable. Hence, SNR 10 has been used as a performance metric of SNR at low illumination conditions. SNR 10 stands for the illuminance (lux) where a target SNR=10 is reached after white balance and color correction. As shown in FIG. 5A, when SNR 10 (illuminance, lux) is lower, the optical sensor 1 can generate image quality of SNR=10 under a lower illumination environment. When the acute angle A1 and the acute angle A2 are greater than 65 degrees, the SNR 10 of the optical sensor 1 of the present disclosure is greater than the conventional optical sensor. Therefore, under the same low illumination condition, the quality of the image generated by the optical sensor 1 of the present disclosure is better than the quality of the image generated by the conventional optical sensor.

Figure 5B:
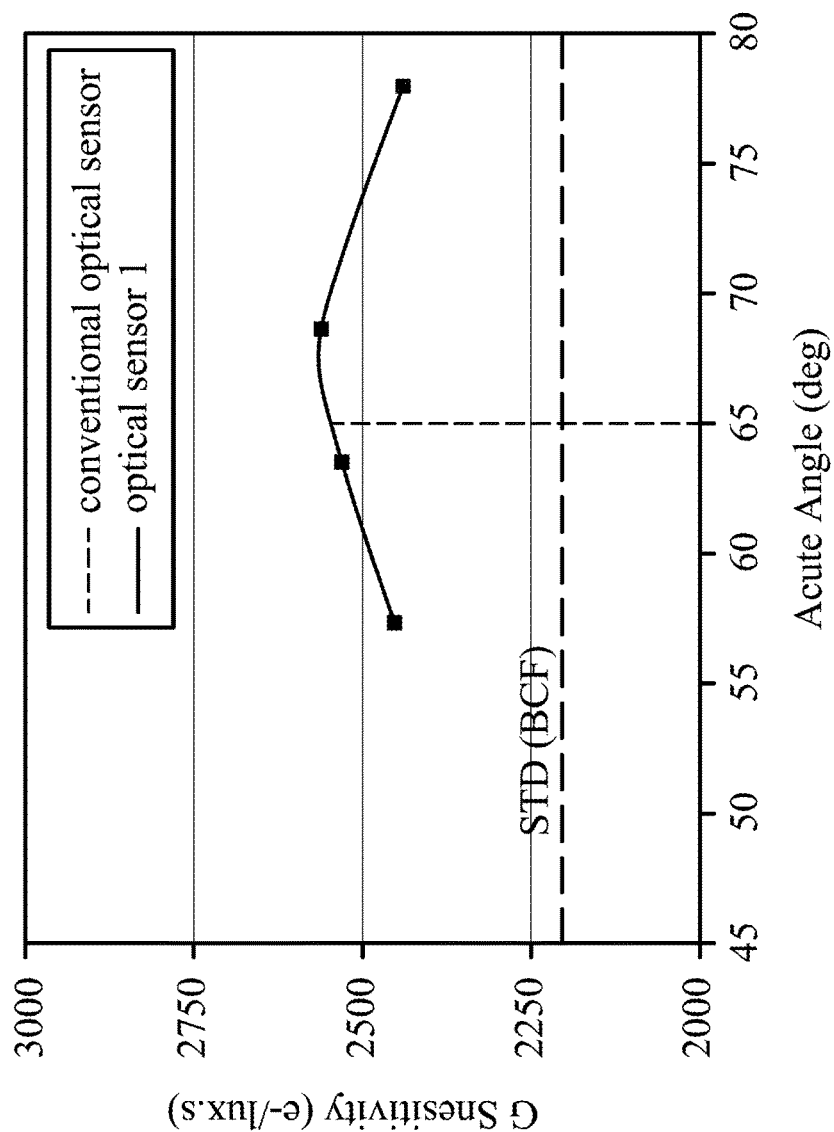
FIG. 5B shows acute angle vs. G-Sensitivity diagrams of the optical sensor and the conventional optical sensor in accordance with some embodiments of the present disclosure.

FIG. 5B shows acute angle vs. G-Sensitivity diagrams of the optical sensor 1 and the conventional optical sensor in accordance with some embodiments of the present disclosure. When the acute angle A1 and A2 are greater than 65 degrees, the G-Sensitivity of the optical sensor 1 of the present disclosure is greater than the conventional optical sensor.

Figure 6:
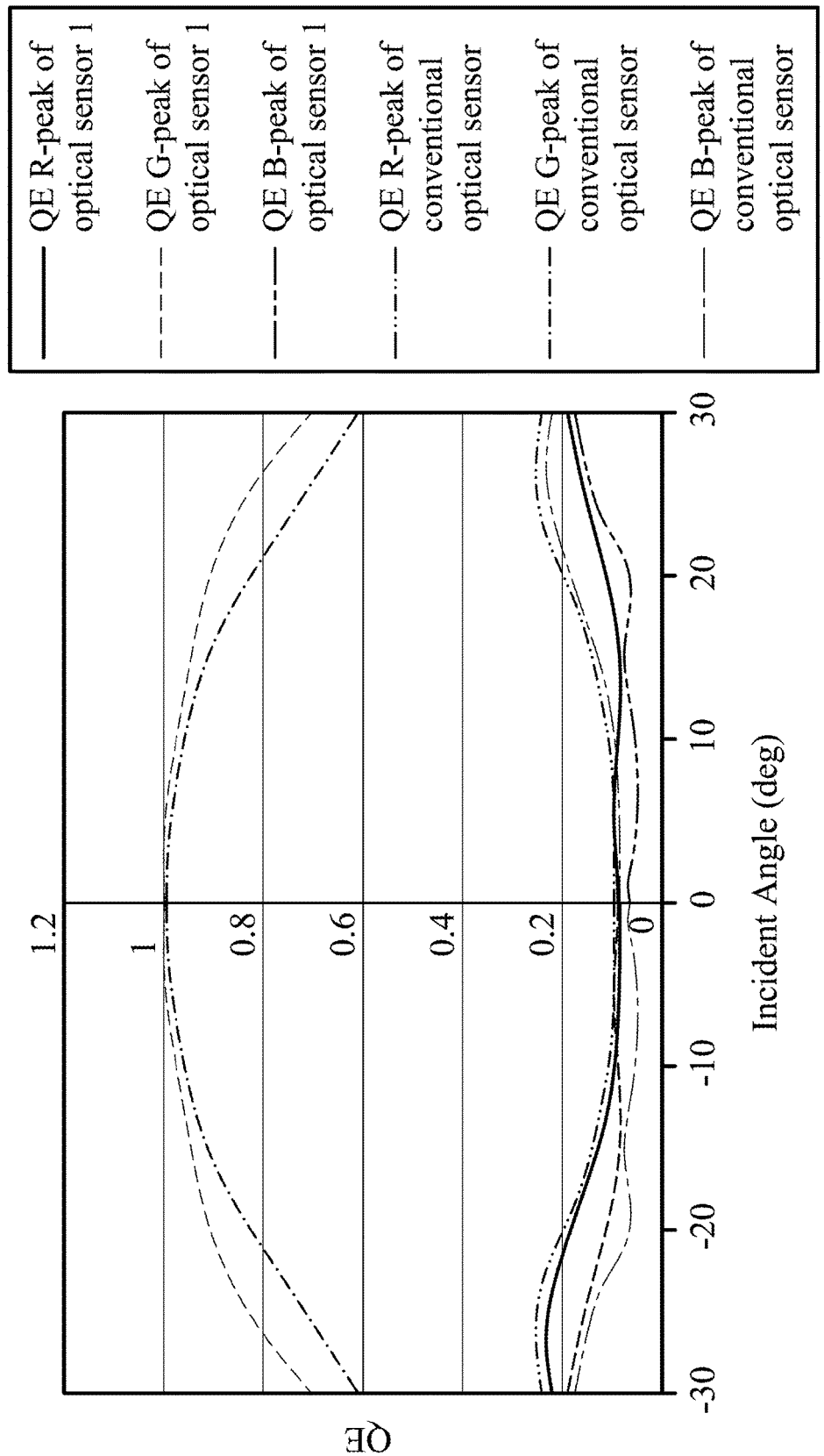
FIG. 6 is incident angle vs. QE spectrum diagram of the optical sensor emitted by a 530 nm incident light beam of the present disclosure and a conventional optical sensor with microlenses.

FIG. 6 is incident angle vs. QE spectrum diagram of the optical sensor 1 emitted by a 530 nm incident light beam of the present disclosure and a conventional optical sensor with microlenses. The QE G-peak of the optical sensor 1 is improved in comparison with the conventional optical sensor when the incident angle of the 530 nm light beam is in a range from about 0 degrees to 30 degrees. The QE R-peak and the QE B-peak of the optical sensor 1 are also improved in comparison with the conventional optical sensor when the incident angle of the 530 nm incident light beam is in a range from about 0 degrees to 30 degrees.

Therefore, the optical sensor 1 may have a great performance depending on the structures and the designs of the color filters 20. Conventional microlenses may not be needed in the optical sensor 1.

Figure 7:
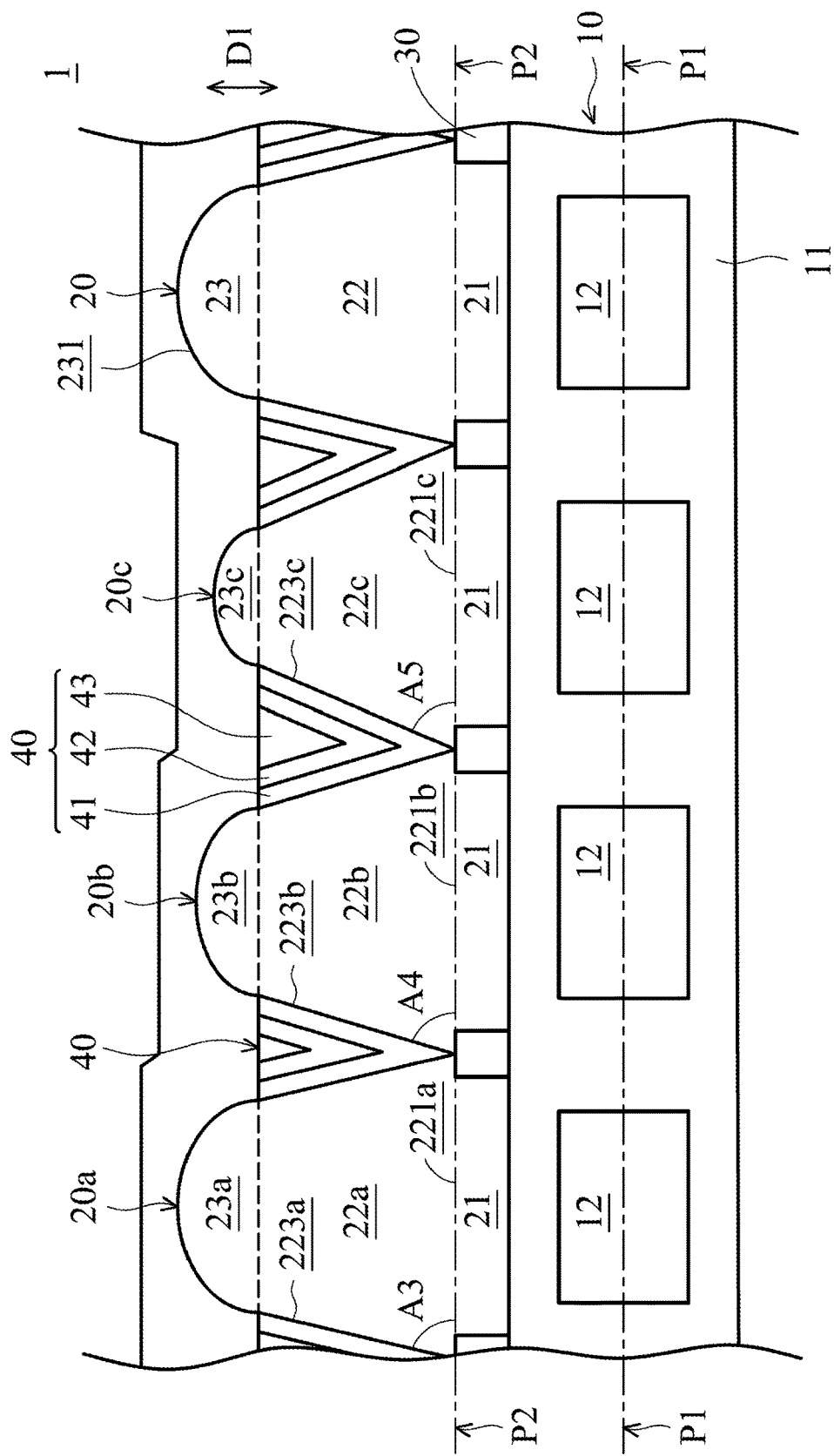
FIG. 7 is a schematic view of an optical sensor in accordance with some embodiments of the present disclosure.

FIG. 7 is a schematic view of an optical sensor 1 in accordance with some embodiments of the present disclosure. The grid structure 40 includes at least two grid layers stacked on each other, and includes at least two different materials. In this embodiment, the grid structure 40 includes a first grid layer 41, a second grid layer 42, and a third grid layer 43. The first grid layer 41 is disposed on the shading structure 30. The second grid layer 42 is disposed on the first grid layer 41. The third grid layer 43 is disposed on the second grid layer 42.

The materials of the first grid layer 41, the second grid layer 42, and the third grid layer 43 are different. In some embodiments, the refractive index of the first grid layer 41 is greater than the refractive index of the second grid layer 42. The refractive index of the second grid layer 42 is greater than the refractive index of the third grid layer 43. In some embodiments, the cross sections of the first grid layer 41, and the second grid layer 42 are V-shaped. The cross section of the third grid layer 43 is triangular. The cross sections are perpendicular to the bottom surface 221.

Depending on the structures and designs of the grid structure 40, the light beam emitted to the optical sensor 1 is greatly guided emitted to the photodiodes 12.

In some embodiments, the color filters 20 include color filter 20*a*, 20*b* and 20*c*. The color filters 20*a* are blue color filters. The color filters 20*b* are green color filters. The color filters 20*c* are red color filters.

The inclined surface 223*a* of the upper portion 22*a* of the color filter 20*a* is inclined relative to the bottom surface 221*a*. Between the inclined surface 223*a* and the bottom surface 221*a* is an acute angle A3. The inclined surface 223*b* of the upper portion 22*b* of the color filter 20*b* is inclined relative to the bottom surface 221*b*. Between the inclined surface 223*b* and the bottom surface 221*b* is an acute angle A4.

The inclined surface 223*c* of the upper portion 22*c* of the color filter 20*c* is inclined relative to the bottom surface 221*c*. Between the inclined surface 223*c* and the bottom surface 221*c* is an acute angle A5. The acute angle A3 is greater than the acute angle A4. The acute angle A4 is greater than the acute angle A5. The acute angles A3, A4 and A5 are in a range from about 65 degrees to 89 degrees.

Depending on the described acute angles A3, A4 and A5 of the color filters 20, the quantity of the light beam in guided into the color filter 20*a* is greater than the quantity of the light beam in guided in the color filter 20*b*. The quantity of the light beam in guided into the color filter 20*b* is greater than the quantity of the light beam in guided in the color filter 20*c*. Therefore, the image generated by the optical sensor 1 can be improved by adjusting the acute angles A3, A4 and A5 of the color filters 20.

The color filters 20 further include dome portions 23 disposed on the upper portions 22. Each of the dome portions 23 includes an arched top surface 231. Therefore, the dome portions 23 are functioned as the conventional microlens. The dome portions 23 can focus light beams to the photodiodes 12. Depending on the structures and designs of the dome portions 23, the light beam emitted to the optical sensor 1 is greatly guided emitted to the photodiodes 12.

In some embodiments, the color filter 20*a* further includes a dome portion 23*a* disposed on the upper portion 22*a*. The color filter 20*b* further includes a dome portion 23*b* disposed on the upper portion 22*b*. The color filter 20*c* further includes a dome portion 23*c* disposed on the upper portion 22*c*. The height of the dome portion 23*a* relative to the upper portion 22*a* is greater than the height of the dome portion 23*b* relative to the upper portion 22*b*. The height of the dome portion 23*b* relative to the upper portion 22*b* is greater than the height of the dome portion 23*c* relative to the upper portion 22*c*. The heights of the dome portion 23*a*, 23*b* and 23*c* are in a range from about 50 nm to 150 nm.

By the heights of the dome portions 23, the quantity of the light beam in guided into the color filter 20*a* is greater than the quantity of the light beam in guided in the color filter 20*b*. The quantity of the light beam in guided into the color filter 20*b* is greater than the quantity of the light beam in guided in the color filter 20*c*. The image generated by the optical sensor 1 can be improved by adjusting the heights of the dome portions 23.

In some embodiments, the thickness of the anti-reflection film 50 over the upper portion 22a is greater than the thickness of the anti-reflection film 50 over the upper portion 22b. The thickness of the anti-reflection film 50 over the upper portion 22b is greater than the thickness of the anti-reflection film 50 over the upper portion 22c.

By the thicknesses of the anti-reflection film 50, the quantity of the light beam in guided into the color filter 20a is greater than the quantity of the light beam in guided in the color filter 20b. The quantity of the light beam in guided into the color filter 20b is greater than the quantity of the light beam in guided in the color filter 20c. The image generated by the optical sensor 1 can be improved by adjusting the thickness of the anti-reflection film 50.

In conclusion, the optical sensor does not need to include conventional microlenses depending on the structure of the color filters. Therefore, the thickness and the manufacturing cost of the optical sensor are decreased.

The features disclosed may be combined, modified, or replaced in any suitable manner in one or more disclosed embodiments, but are not limited to any particular embodiments.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical sensor, comprising:
   a sensing layer comprising a photodiode;
   a first color filter comprising a first lower portion disposed on the sensing layer, and a first upper portion disposed on the first lower portion, wherein the first upper portion comprises a first bottom interface connected to the first lower portion, a first inclined surface inclined relative to the first bottom interface, and a second inclined surface opposite to the first inclined surface and inclined relative to the first bottom interface;
   a shading structure surrounding the first lower portion; and
   a grid structure surrounding the first upper portion, wherein the grid structure comprises a first grid layer disposed on the shading structure, a second grid layer disposed on the first grid layer, and a third grid layer disposed on the second grid layer,
   wherein a refractive index of the first grid layer is greater than a refractive index of the second grid layer, and a refractive index of the second grid layer is greater than a refractive index of the third grid layer,
   wherein between the first inclined surface and the first bottom interface is a first acute angle, and between the second inclined surface and the first bottom interface is a second acute angle.

2. The optical sensor as claimed in claim 1, wherein the first acute angle and the second acute angle are in a range from about 65 degrees to 89 degrees.

3. The optical sensor as claimed in claim 1, wherein the first acute angle is equal to the second acute angle.

4. The optical sensor as claimed in claim 1, wherein the first inclined surface and the second inclined surface are symmetrically arranged about a symmetry plane of the first color filter.

5. The optical sensor as claimed in claim 1, wherein the first upper portion further comprises a top surface opposite to the first bottom interface, and the first upper portion narrows gradually from the first bottom interface to the top surface.

6. The optical sensor as claimed in claim 1, wherein a cross section of the first upper portion has a trapezoidal shape, and the cross section of the first upper portion is perpendicular to the first bottom interface and the first inclined surface.

7. The optical sensor as claimed in claim 1, wherein the first lower portion and the first upper portion are formed as a single piece, and comprise the same materials.

8. The optical sensor as claimed in claim 1, wherein cross sections of the first grid layer and the second grid layer are V-shaped.

9. The optical sensor as claimed in claim 1, wherein the materials of the first grid layer, the second grid layer, and the third grid layer are different.

10. The optical sensor as claimed in claim 1, wherein a thickness of the first color filter is greater than 1 urn.

11. An optical sensor, comprising:
    a sensing layer comprising a photodiode;
    a first color filter comprising a first lower portion disposed on the sensing layer, and a first upper portion disposed on the first lower portion, wherein the first upper portion comprises a first bottom interface connected to the first lower portion, a first inclined surface inclined relative to the first bottom interface, and a second inclined surface opposite to the first inclined surface and inclined relative to the first bottom interface; and
    a grid structure surrounding the first upper portion;
    wherein between the first inclined surface and the first bottom interface is a first acute angle, and between the second inclined surface and the first bottom interface is a second acute angle,
    wherein the first color filter further comprises a first dome portion, disposed on the first upper portion, comprises an arched top surface, wherein the first lower portion, the first upper portion and the dome portion are formed as a single piece, and comprise the same materials.

12. The optical sensor as claimed in claim 11, further comprising:
    a second color filter comprising a second lower portion disposed on the sensing layer, and a second upper portion disposed on the second lower portion, wherein the second upper portion comprises a second bottom interface connected to the second lower portion, and a third inclined surface inclined relative to the second bottom interface,
    a third color filter comprising a third lower portion disposed on the sensing layer, and a third upper portion disposed on the third lower portion, wherein the third upper portion comprises a third bottom interface connected to the third lower portion, and a fourth inclined surface inclined relative to the third bottom interface,
    wherein between the third inclined surface and the second bottom interface is a third acute angle, between the fourth inclined surface and the third bottom interface is a fourth acute angle, the first acute angle is greater than the third acute angle, and the third acute angle is greater than the fourth acute angle.

13. The optical sensor as claimed in claim 12, wherein the first color filter is a blue color filter, the second color filter is a green color filter, and the third color filter is a red color filter.

14. The optical sensor as claimed in claim 12, wherein the first color filter further comprises a first dome portion disposed on the first upper portion, the second color filter further comprises a second dome portion disposed on the second upper portion, and the third color filter further comprises a third dome portion disposed on the third upper portion.

15. The optical sensor as claimed in claim 14, wherein a height of the first dome portion relative to the first upper portion is greater than a height of the second dome portion relative to the second upper portion, and a height of the second dome portion relative to the second upper portion is greater than a height of the third dome portion relative to the third upper portion.

16. The optical sensor as claimed in claim 14, wherein heights of the first dome portion relative to the first upper portion, the second dome portion relative to the second upper portion, and the third dome portion relative to the third upper portion is in a range from about 50 nm to 150 nm.

17. The optical sensor as claimed in claim 12, further comprising an anti-reflection film disposed on the first upper portion, the second upper portion and the third upper portion, wherein a thickness of the anti-reflection film is in a range from about 100 nm to 250 nm.

18. The optical sensor as claimed in claim 17, wherein a thickness of the anti-reflection film over the first upper portion is greater than a thickness of the anti-reflection film over the second upper portion, and a thickness of the anti-reflection film over the second upper portion is greater than a thickness of the anti-reflection film over the third upper portion.

* * * * *